United States Patent
Koike et al.

(10) Patent No.: US 8,004,162 B2
(45) Date of Patent: Aug. 23, 2011

(54) PIEZOELECTRIC DEVICE, ANGULAR VELOCITY SENSOR, ELECTRONIC APPARATUS, AND PRODUCTION METHOD OF A PIEZOELECTRIC DEVICE

(75) Inventors: Nobuyuki Koike, Miyagi (JP); Takashi Tamura, Miyagi (JP)

(73) Assignee: Sony Corporation, Tokyo (JP)

(*) Notice: Subject to any disclaimer, the term of this patent is extended or adjusted under 35 U.S.C. 154(b) by 102 days.

(21) Appl. No.: 12/545,524

(22) Filed: Aug. 21, 2009

(65) Prior Publication Data
US 2010/0045144 A1    Feb. 25, 2010

(30) Foreign Application Priority Data
Aug. 25, 2008  (JP) ................... 2008-215367

(51) Int. Cl.
*H01L 41/08* (2006.01)
(52) U.S. Cl. ................... 310/358; 252/62.9 PZ
(58) Field of Classification Search .......... 310/357–359; 252/62.9 PZ
See application file for complete search history.

(56) References Cited

U.S. PATENT DOCUMENTS

| | | | |
|---|---|---|---|
| 6,548,937 B1* | 4/2003 | Klee et al. ............ | 310/324 |
| 7,102,274 B2* | 9/2006 | Kita ...................... | 310/358 |
| 7,381,464 B2* | 6/2008 | Ito et al. ................ | 428/402 |
| 7,601,278 B2* | 10/2009 | Meyer et al. ........... | 252/500 |
| 7,710,656 B2* | 5/2010 | Peuchert et al. ....... | 359/642 |
| 7,820,723 B2* | 10/2010 | Belleville et al. ...... | 516/33 |
| 2006/0116273 A1* | 6/2006 | Ito et al. ................ | 501/137 |
| 2008/0278823 A1* | 11/2008 | Peuchert et al. ....... | 359/664 |
| 2009/0283419 A1* | 11/2009 | Del-Gallo et al. ..... | 205/628 |

FOREIGN PATENT DOCUMENTS

| | | |
|---|---|---|
| EP | 1941558 | 7/2008 |
| JP | 06-350154 | 12/1994 |
| JP | 2005-005689 | 1/2005 |
| JP | 2007-116091 | 5/2007 |

* cited by examiner

*Primary Examiner* — Mark Budd
(74) *Attorney, Agent, or Firm* — K&L Gates LLP

(57) ABSTRACT

A piezoelectric device is provided and includes a substrate, a first electrode film, a piezoelectric film, and a second electrode film. The first electrode film is formed on the substrate. The piezoelectric film is represented by $Pb_{1+x}(Zr_YTi_{1-Y})O_{3+x}$ ($0 \leqq X \leqq 0.3$, $0 \leqq Y \leqq 0.55$) and a peak intensity of a pyrochlore phase measured by an X-ray diffraction method is 10% or less with respect to a sum of peak intensities of a (100) plane orientation, a (001) plane orientation, a (110) plane orientation, a (101) plane orientation, and a (111) plane orientation of a perovskite phase, the piezoelectric film being formed on the first electrode film with a film thickness of 400 nm or more and 1,000 nm or less. The second electrode film is laminated on the piezoelectric film.

9 Claims, 11 Drawing Sheets

PIEZOELECTRIC DEVICE, ANGULAR VELOCITY SENSOR, ELECTRONIC APPARATUS, AND PRODUCTION METHOD OF A PIEZOELECTRIC DEVICE

CROSS REFERENCES TO RELATED APPLICATIONS

The present application claims priority to Japanese Priority Patent Application JP 2008-215367 filed in the Japan Patent Office on Aug. 25, 2008, the entire content of which is hereby incorporated by reference.

BACKGROUND

The present disclosure relates to a piezoelectric device such as an angular velocity sensor, a piezoelectric actuator, and a pyroelectric infrared ray sensor, a production method thereof, and an electronic apparatus equipped with the piezoelectric device.

In the past, lead zirconium titanate (hereinafter, referred to as PZT) is used for a piezoelectric film used in a piezoelectric device such as an angular velocity sensor. Various techniques are proposed for improving piezoelectric characteristics, ferroelectric characteristics, pyroelectric characteristics, and the like of the PZT.

Japanese Patent Application Laid-open No. Hei 06-350154 (hereinafter, referred to as Patent Document 1) discloses a PZT thin film whose crystalline structure is rhombohedral, in which, when lead zirconium titanate is represented by $Pb_{1-Y}(Zr_XTi_{1-X})O_{3+Y}$, a PbO excessive composition ratio Y is within a range of $0 \leq Y \leq 0.5$, and a Zr composition ratio X is within a range of $0 \leq X \leq 0.55$.

Japanese Patent Application Laid-open No. 2005-5689 (hereinafter, referred to as Patent Document 2) discloses a piezoelectric element constituted of a first electrode film, a second electrode film, and a piezoelectric thin film sandwiched between the first electrode film and the second electrode film. The piezoelectric thin film is constituted of an oxide piezoelectric thin film having an oxygen loss larger than 0% and equal to or smaller than 10% with respect to a stoichiometric composition. Moreover, the piezoelectric element equipped with a piezoelectric thin film having such an oxygen loss has stronger piezoelectric characteristics than an oxide piezoelectric thin film having a stoichiometric composition.

Japanese Patent Application Laid-open No. 2007-116091 (hereinafter, referred to as Patent Document 3) discloses a piezoelectric body including a first ferroelectric substance crystal that has a crystal orientation when not applied with an electric field, the piezoelectric body being provided with characteristics with which, due to an application of an electric field of a predetermined electric field intensity or more, at least a part of the first ferroelectric substance crystal undergoes a phase transition to a second ferroelectric substance crystal having a different crystal system from the first ferroelectric substance crystal. According to this piezoelectric body, a large distortion displacement amount can stably be obtained.

Incidentally, when heated, a piezoelectric material is known to deteriorate in piezoelectric performance, which is called depolarization. However, because a heat treatment by solder reflow and the like is generally carried out in a process of mounting electronic components on a wiring substrate, there is a problem that the piezoelectric performance of the piezoelectric material deteriorates due to the heat.

Particularly in recent years, a solder reflow temperature is increasing due to lead-free soldering in consideration of environmental problems, and heat caused by the solder reflow causes the piezoelectric performance of the piezoelectric material to deteriorate, which is problematic. However, Patent Documents 1 to 3 above give no consideration to the effect of heat.

In view of the circumstances as described above, there is a need for a piezoelectric device having excellent heat resistance, an angular velocity sensor, an electronic apparatus, and a production method of a piezoelectric device.

SUMMARY

According to an embodiment, there is provided a piezoelectric device including a substrate, a first electrode film, a piezoelectric film, and a second electrode film.

The first electrode film is formed on the substrate. The piezoelectric film is represented by $Pb_{1+X}(Zr_YTi_{1-Y})O_{3+X}$ ($0 \leq X \leq 0.3$, $0 \leq Y \leq 0.55$) and a peak intensity of a pyrochlore phase measured by an X-ray diffraction method is 10% or less with respect to a sum of peak intensities of a (100) plane orientation, a (001) plane orientation, a (110) plane orientation, a (101) plane orientation, and a (111) plane orientation of a perovskite phase (hereinafter, referred to as "sum of X-ray diffraction peak intensities of a perovskite phase"). The piezoelectric film is formed with a film thickness of 400 nm or more and 1,000 nm or less.

The second electrode film is used for applying a voltage to the piezoelectric film and is laminated on the piezoelectric film.

The perovskite phase and the pyrochlore phase are common in the point of both being a transition metal oxide, but properties thereof differ largely. Specifically, while piezoelectric characteristics of a piezoelectric body are solely attributable to an abundance ratio of a perovskite phase in a film, the pyrochlore phase does not have a property that contributes to piezoelectric characteristics and rather acts to negate the piezoelectric characteristics given by the perovskite phase. Therefore, an increase in a ratio of the pyrochlore phase in the piezoelectric film induces lowering of a piezoelectric constant or an increase in a dielectric loss, thus causing deterioration of characteristics required for the piezoelectric film. In this regard, the inventors of the present application have found that a presence of a pyrochlore phase in a film also affects heat resistance of a piezoelectric device and completed the present application.

Specifically, in the piezoelectric film formed of lead zirconium titanate, which is formed with a thickness of 400 nm or more and 1,000 nm or less, a ratio of an X-ray diffraction peak intensity of a pyrochlore phase to a sum of X-ray diffraction peak intensities of a perovskite phase is set to be 10% or less. Accordingly, as compared to a case where the intensity ratio exceeds 10%, piezoelectric characteristics do not deteriorate under high temperature and it becomes possible to dramatically improve heat resistance.

In the piezoelectric film, a part of a transition metal element (Zr and/or Ti) may be substituted by at least one element among elements of Cr, Mn, Fe, Ni, Mg, Sn, Cu, Ag, Nb, Sb, and N. The same holds true in descriptions below.

The perovskite phase can be formed to have an orientation rate of 60% or more in a (100)/(001) direction.

Accordingly, even when the piezoelectric film is exposed to a high-temperature environment, it becomes possible to suppress deterioration of piezoelectric characteristics and stably maintain desired piezoelectric characteristics.

In the specification, the "orientation rate" is defined as an orientation rate F measured by a Lotgerling method (see F. K. Lotgerling: J. Inorg, Nucl. Chem., 9(1959).113).

Specifically, the orientation rate F is expressed by the following expression.

$$F(\%)=[(P-P0)/(1-P0)]*100 \quad (i)$$

In Expression (i), P is a ratio of a sum of reflection intensities from an orientation plane to a sum of total reflection intensities. In a case of a (001) orientation, P is a ratio of a sum $\Sigma I(001)$ of reflection intensities $I(001)$ from a (001) plane to a sum $\Sigma I(hk1)$ of reflection intensities $I(hk1)$ from all crystal planes (hk1) ($\{\Sigma I(001)/\Sigma I(hk1)\}$). For example, in a case of a (001) orientation in a perovskite crystal, $P=I(001)/[I(001)+I(100)+I(101)+I(110)+I(111)]$ is established.

P0 represents P of a sample that shows a perfectly random orientation. When showing a perfectly random orientation (P=P0), F is 0%. When being perfectly oriented (P=1), F is 100%.

The piezoelectric film is subjected to a heat treatment for eliminating the pyrochlore phase in the film.

Accordingly, since an abundance ratio of the pyrochlore phase in the film decreases; it becomes possible to enhance heat resistance of the piezoelectric film.

The piezoelectric film may be constituted of a thin film formed of lead zirconium titanate represented by $Pb_{1+X}(Zr_YTi_{1-Y})O_{3+X}$ ($0\leq X\leq 0.3$, $0\leq Y\leq 0.55$) or lead titanate.

Accordingly, a piezoelectric film having high characteristics can be stably obtained.

The piezoelectric film may be constituted of a sputter film formed of lead zirconium titanate or lead titanate formed on the first electrode film.

Accordingly, it becomes possible to form a high-density piezoelectric film having high adhesiveness with respect to the first electrode film.

According to an embodiment, there is provided a production method of a piezoelectric device including forming an electrode film on a substrate. On the electrode film, a piezoelectric film represented by $Pb_{1+X}(Zr_YTi_{1-Y})O_{3+X}$ ($0\leq X\leq 0.3$, $0\leq Y\leq 0.55$) whose perovskite phase has an orientation rate of 60% or more in a (100)/(001) direction is formed with a film thickness of 400 nm or more and 1,000 nm or less. For eliminating the pyrochlore phase in the piezoelectric film, the piezoelectric film is subjected to a heat treatment under conditions of a rate of temperature rise of 5° C./sec or more, a retention temperature of 600° C. or more and 900° C. or less, and a retention time of 10 minutes or more.

The heat treatment on the piezoelectric film is carried out for the purpose of eliminating the pyrochlore phase in the film right after the deposition. Due to the heat treatment, the peak intensity of the pyrochlore phase measured by the X-ray diffraction method can be suppressed to be 10% or less with respect to the sum of X-ray diffraction peak intensities of the perovskite phase. Accordingly, it becomes possible to produce a piezoelectric device having excellent heat resistance and whose piezoelectric characteristics do not deteriorate under high temperature.

The piezoelectric film may be formed by a sputtering method.

Accordingly, a high-density piezoelectric film having excellent adhesiveness with respect to the electrode film can be formed.

In forming the piezoelectric film, the substrate may be heated to a temperature of 400° C. or more and 600° C. or less.

Accordingly, formation of crystalline lead zirconium titanate on the substrate can be promoted.

An electronic apparatus according to an embodiment includes the thus-structured piezoelectric device.

Moreover, an electronic apparatus according to an embodiment includes an angular velocity sensor having the structure described above.

Since the piezoelectric device and the angular velocity sensor have excellent piezoelectric characteristics and heat resistance, a highly-reliable electronic apparatus can be provided.

As described above, according to the embodiments, a piezoelectric device and an angular velocity sensor including a piezoelectric film having excellent heat resistance can be obtained.

Additional features and advantages are described herein, and will be apparent from the following Detailed Description and the figures.

DETAILED DESCRIPTION

Hereinafter, embodiments will be described with reference to the drawings.

Figure 1A:
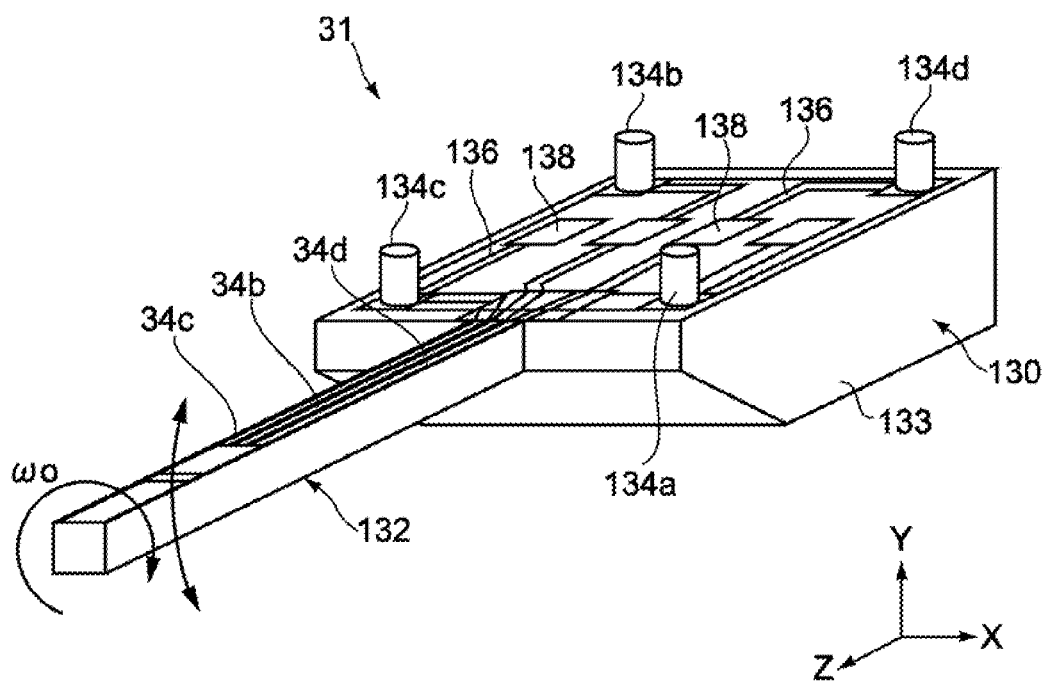
FIG. 1 are diagrams showing a schematic structure of an angular velocity sensor device according to an embodiment, FIG. 1A being an overall perspective view on a mounting surface side, FIG. 1B being a cross-sectional diagram showing main portions.
Figure 1B:
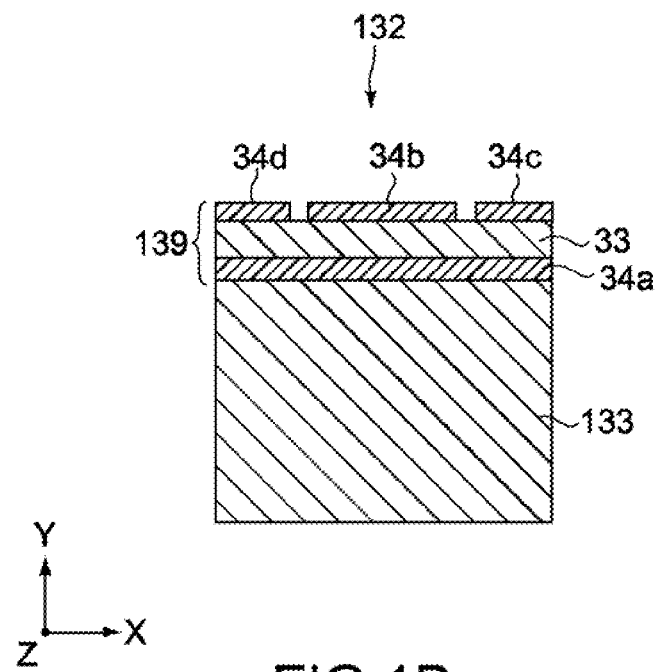

FIG. 1A is a perspective view showing an angular velocity sensor device (piezoelectric device) according to an embodiment. An angular velocity sensor device 31 includes a base body 130 and a vibration arm 132 that extends from the base body 130 and is capable of vibrating. FIG. 1B is a cross-sectional diagram of a surface vertical to a longitudinal axis (Z axis) of the vibration arm 132 of the angular velocity sensor device 31.

The angular velocity sensor device 31 includes a substrate 133 made of a non-piezoelectric material such as silicon (Si) and a piezoelectric functional layer 139 provided on the substrate 133. The substrate 133 is cut out from a silicon substrate in a shape shown in the figure, and the piezoelectric functional layer 139 is formed on the vibration arm 132 of the substrate 133.

Sizes of the respective portions of the angular velocity sensor device 31 are roughly as follows; a total length (Z axis) is 3 mm, a thickness (Y axis) and width (X axis) of the base body 130 are 300 μm and 1 mm, respectively, and a thickness, length, and width of the vibration arm 132 are 100 μm, 2.5 mm, and 100 μm, respectively. A longitudinal resonance frequency of the vibration arm 132 in the Y-axis direction is about 40 kHz. It should be noted that the numerical values above are merely an example and can be set arbitrarily based on a frequency used and a size of a device.

As shown in FIG. 1B, the piezoelectric functional layer 139 includes a first electrode film 34a formed on a surface of the substrate 133, a piezoelectric film 33 formed on the first electrode film 34a, and a second electrode film 34b and a pair of detection electrodes 34c and 34d formed on the piezoelectric film 33. The detection electrodes 34c and 34d are disposed on the piezoelectric film 33 so as to sandwich the second electrode film 34b. Those films are formed by a sputtering method.

A metal material is used for the first electrode film 34a, and a multiple layer of Ti and Pt is used in this embodiment. The Pt film is formed for enhancing a crystal orientation of the piezoelectric film formed thereon. The Ti film is formed for enhancing adhesiveness between the substrate 133 formed of silicon and the Pt film. A film thickness of the first electrode film 34a is not particularly limited, and the Ti film is formed to be 30 nm and the Pt film is formed to be 100 nm in this embodiment. It should be noted that the metal film constituting the first electrode film 34a is not limited to the Ti/Pt film described above. An example of the metal film is a monolayer film or a laminated film of Ir, Au, Ru, and the like.

The second electrode film 34b and the detection electrodes 34c and 34d can be formed of the same metal material as the first electrode film 34a. The second electrode film 34b and the detection electrodes 34c and 34d can be formed by pattern-etching an electrode layer formed on the piezoelectric film 33. A thickness of the electrode layer is not particularly limited, and the electrode layer may be formed with the same thickness as the first electrode film 34a or may be formed to be thicker than the first electrode film 34a.

The piezoelectric film 33 can be constituted of lead zirconium titanate (PZT) represented by $Pb_{1+X}(Zr_Y Ti_{1-Y})O_{3+X}$ or lead titanate. By setting X above to be 0 or more and 0.3 or less and Y above to be 0 or more and 0.55 or less, a piezoelectric film having high piezoelectric characteristics and excellent heat resistance can be obtained. In the piezoelectric film, a part of a transition metal element (Zr and/or Ti) may be substituted by at least one element among elements of Cr, Mn, Fe, Ni, Mg, Sn, Cu, Ag, Nb, Sb, and N.

Figure 2:
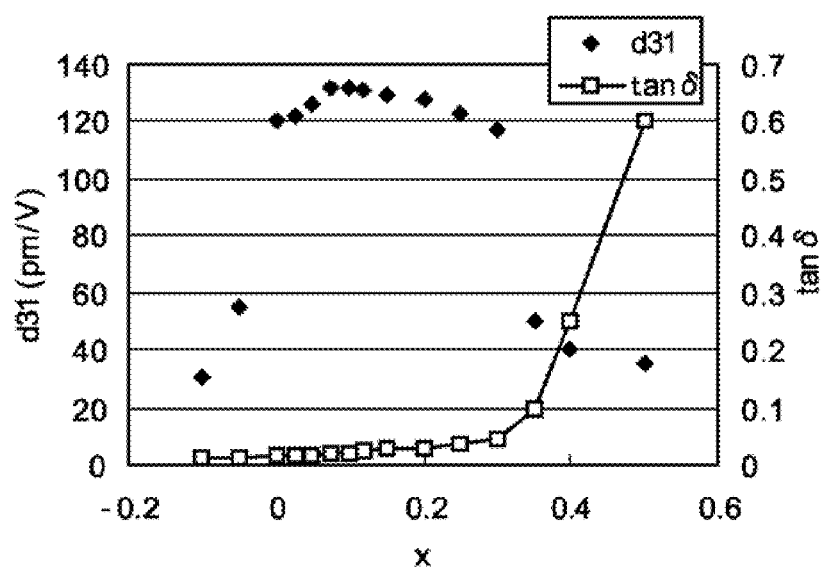
FIG. 2 is an experimental result showing a relationship among a PbO composition ratio (X), a piezoelectric constant (d31), and a dielectric loss (tan δ) prior to a heat treatment of a PZT thin film constituting the angular velocity sensor device.

FIG. 2 is an experimental result showing a composition dependence of an excessive PbO amount (X) regarding a piezoelectric constant (d31) and a dielectric loss (tan δ) prior to a heat treatment on the piezoelectric film represented by $Pb_{1+X}(Zr_Y Ti_{1-Y})O_{3+X}$ (Y=0.5). Here, "d31" representing the piezoelectric constant indicates an expansion/contraction amount (distortion/electric field (unit: pm/V)) in a direction along an electrode surface at a time when a voltage is applied (the same holds true in descriptions below). Therefore, more favorable piezoelectric characteristics can be obtained as the piezoelectric constant increases.

It can be seen from FIG. 2 that in the piezoelectric film represented by $Pb_{1+X}(Zr_Y Ti_{1-Y})O_{3+X}$, a piezoelectric constant and dielectric loss favorable as an angular velocity sensor can be obtained in a range of $0 \leq X \leq 0.3$ prior to the heat treatment. When X is smaller than 0, the dielectric loss is low but the piezoelectric constant is also low. When X exceeds 0.3, the dielectric loss increases but the piezoelectric constant is low. This is considered to be because the piezoelectric characteristics deteriorate due to deterioration of an insulation property of the piezoelectric film caused by an increase in the content of PbO.

Figure 3:
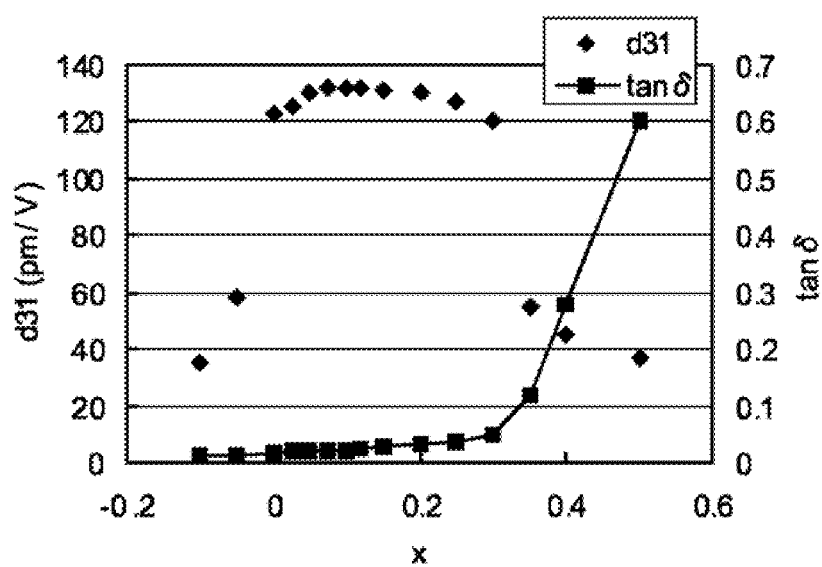
FIG. 3 is an experimental result showing a relationship among the PbO composition ratio (X), the piezoelectric constant (d31), and the dielectric loss (tan δ) after the heat treatment of the PZT thin film constituting the angular velocity sensor device.

FIG. 3 shows characteristics of the piezoelectric film after the heat treatment. A heat treatment condition is set such that a rate of temperature rise is 20° C./sec and a heat treatment temperature is 700° C. Although the piezoelectric characteristics are slightly enhanced, hardly any difference can be seen in the composition dependences before and after the treatment.

Figure 4:
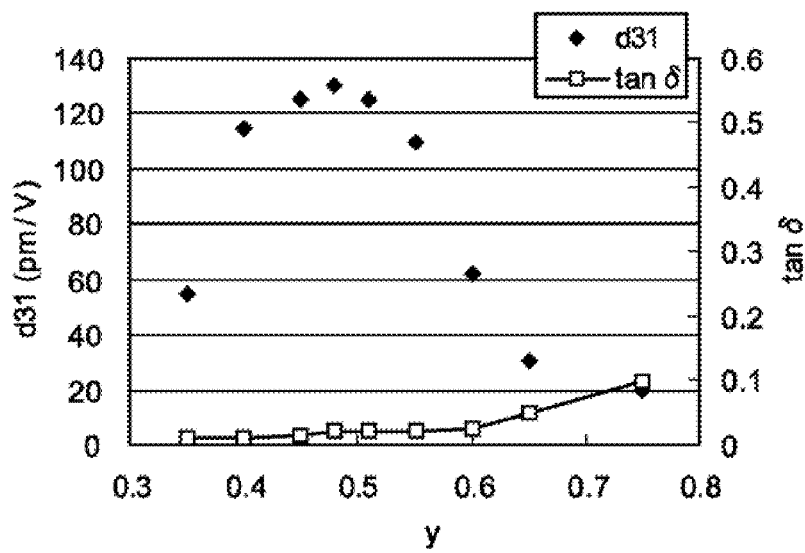
FIG. 4 is an experimental result showing a relationship among a Zr composition ratio (Y), the piezoelectric constant (d31), and the dielectric loss (tan δ) prior to the heat treatment of the PZT thin film constituting the angular velocity sensor device.

FIG. 4 is an experimental result showing a composition dependence of a content of Zr (Y) regarding the piezoelectric constant (d31) and the dielectric loss (tan δ) prior to the heat treatment of the piezoelectric film represented by $Pb_{1+X}(Zr_Y Ti_{1-Y})_{3+X}$ (X=0.04). It can be seen from FIG. 4 that regarding the piezoelectric constant, a maximum piezoelectric constant can be obtained when Y is close to 0.5 and a favorable piezoelectric constant can be obtained in a range of $0.4 \leq Y \leq 0.55$. In addition, a rate of increase of the dielectric loss is increased in a range of $0.6 \leq Y$.

Figure 5:
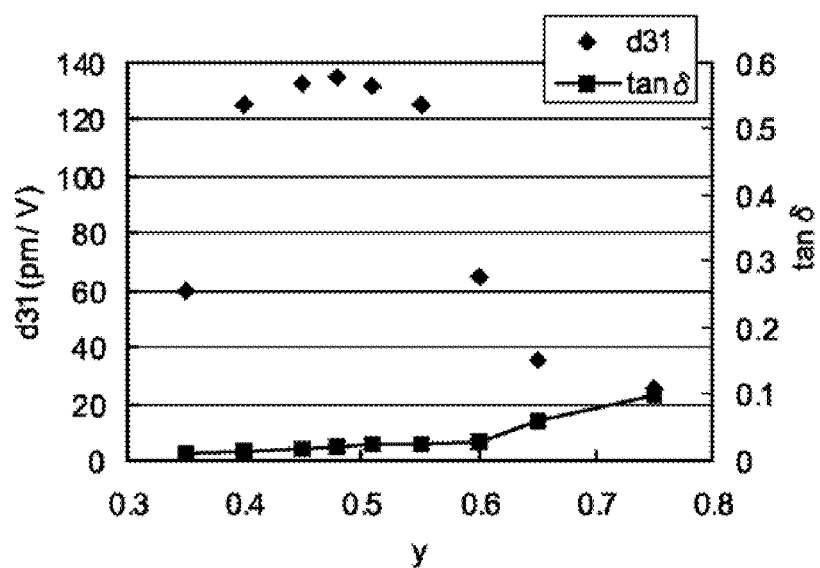
FIG. 5 is an experimental result showing a relationship among the Zr composition ratio (Y), the piezoelectric constant (d31), and the dielectric loss (tan δ) after the heat treatment of the PZT thin film constituting the angular velocity sensor device.

FIG. 5 shows characteristics of the piezoelectric film after the heat treatment. The heat treatment condition is set such that the rate of temperature rise is 20° C./sec and the heat treatment temperature is 700° C. Although the piezoelectric characteristics are slightly enhanced, hardly any difference can be seen in the composition dependences before and after the treatment.

Figure 6:
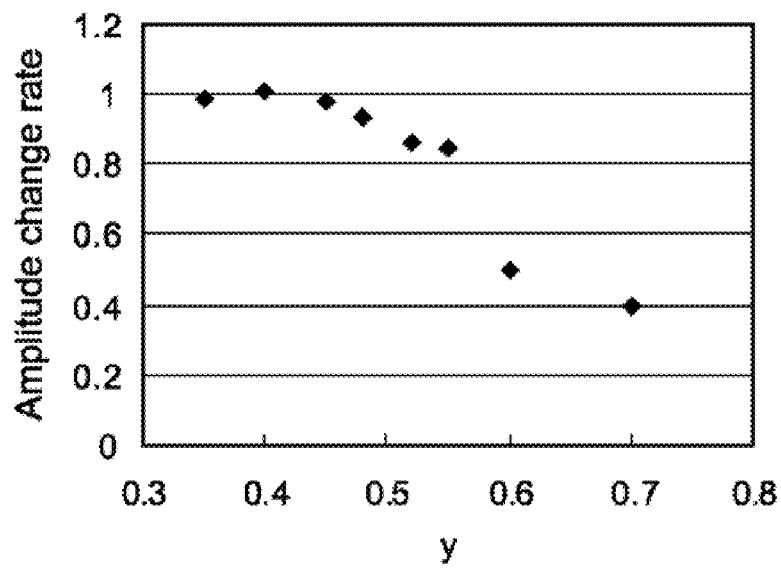
FIG. 6 is an experimental result showing a relationship between the Zr composition ratio (Y) and heat resistance in the PZT thin film constituting the angular velocity sensor device.

FIG. 6 shows a relationship between the Zr composition ratio (Y) and heat resistance of the piezoelectric film after the heat treatment of the piezoelectric film represented by $Pb_{1+X}(Zr_YTi_{1-Y})O_{3+X}(X=0.04)$. The heat resistance of the piezoelectric film was evaluated by an amplitude change rate of the vibration arm 132 of the angular velocity sensor device 31. Here, the amplitude change rate is defined by a ratio of an amplitude of the vibration arm 132 after the piezoelectric film is applied with a thermal load of 240° C. and cooled down to room temperature, to an amplitude thereof at room temperature before the piezoelectric film is applied with the thermal load of 240° C. Therefore, the closer the amplitude change rate is to 1, the smaller the change due to heat becomes, with the result that favorable heat resistance can be obtained.

It can be seen from FIG. 6 that the amplitude ratio drops precipitously in a range of $0.55<Y$. Moreover, although a decrease in the piezoelectric constant can be recognized in a range of $Y \leq 0.4$ from the result of FIG. 4, a change in the amplitude ratio can hardly be recognized in the range of $Y \leq 0.4$ in the result of FIG. 6, which implies that although heat resistance drops precipitously when the content of Zr exceeds a predetermined value, high heat resistance can be maintained when the content of Zr is a predetermined value or less. Therefore, it can be seen from the results of FIGS. 4 and 6 that a range of the Zr composition ratio (Y) in the PZT film with which favorable heat resistance can be obtained is 0 or more and 0.55 or less.

As will be described later, the piezoelectric film 33 is subjected to a heat treatment for lowering an abundance ratio of a pyrochlore phase in the film. Due to the heat treatment, a peak intensity of the pyrochlore phase in the piezoelectric film 33 measured by an X-ray diffraction method is suppressed to be 10% or less with respect to a sum of X-ray diffraction peak intensities of a perovskite phase.

The perovskite phase including a Pb(Zr, Ti)O$_3$-type crystalline structure and the pyrochlore phase including a Pb$_2$(Zr, Ti)$_2$O$_7$-type crystalline structure are common in the point of both being a transition metal oxide, but properties thereof differ largely. Specifically, while piezoelectric characteristics of a piezoelectric body are solely attributable to an abundance ratio of a perovskite phase in a film, the pyrochlore phase does not have a property that contributes to piezoelectric characteristics and rather acts to negate the piezoelectric characteristics given by the perovskite phase. Therefore, an increase in a ratio of the pyrochlore phase in the piezoelectric film induces lowering of the piezoelectric constant or an increase in the dielectric loss, thus causing deterioration of characteristics required for the piezoelectric film. Moreover, it is confirmed that a presence of the pyrochlore phase in the film also affects heat resistance of the piezoelectric device. Thus, by suppressing the abundance ratio of the pyrochlore phase with respect to the perovskite phase to be 10% or less, it becomes possible to obtain piezoelectric characteristics suitable for a piezoelectric device such as an angular velocity sensor while obtaining excellent heat resistance as will be described later.

Figure 7:
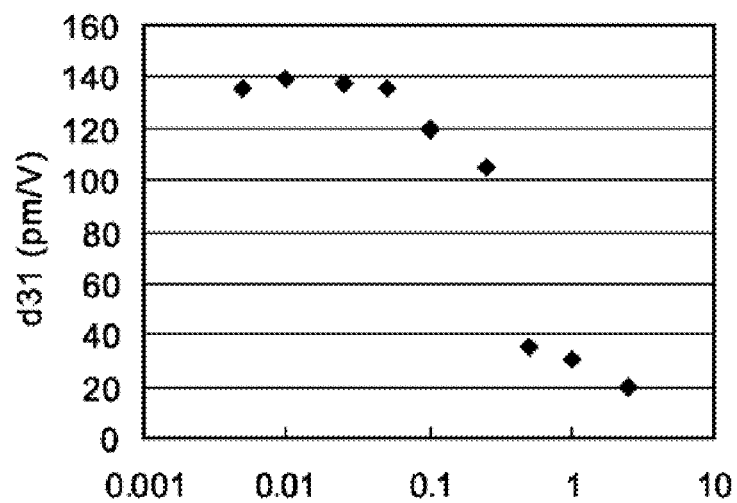
FIG. 7 is an experimental result showing a relationship between an X-ray diffraction peak intensity ratio of a pyrochlore phase and the piezoelectric constant (d31) in the PZT thin film constituting the angular velocity sensor device.

FIG. 7 shows a relationship between the piezoelectric constant (d31) and a ratio of a peak intensity of a pyrochlore phase to a sum of peak intensities of a perovskite phase in crystal orientation planes measured by the X-ray diffraction method (radiation source: CuKα, apparatus: RAD-IIC available from Rigaku Corporation, the same holds in descriptions below) (hereinafter, referred to as "X-ray diffraction peak intensity ratio of a pyrochlore phase"). It can be seen from FIG. 7 that more favorable piezoelectric characteristics can be obtained as the X-ray diffraction peak intensity ratio of the pyrochlore phase decreases. Moreover, it can be recognized that the piezoelectric constant drops prominently near where the X-ray diffraction peak intensity ratio of the pyrochlore phase exceeds 0.1 (10%).

Figure 8:
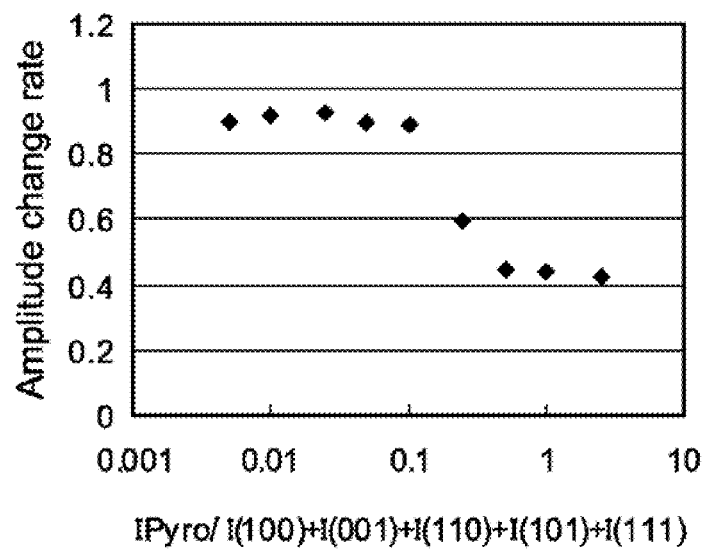
FIG. 8 is an experimental result showing a relationship between the X-ray diffraction peak intensity ratio of the pyrochlore phase and heat resistance in the PZT thin film constituting the angular velocity sensor device.

FIG. 8 shows a relationship between the X-ray diffraction peak intensity ratio of the pyrochlore phase and heat resistance of the piezoelectric film. The heat resistance of the piezoelectric film was evaluated by an amplitude change rate of the vibration arm 132 of the angular velocity sensor device 31. Here, the amplitude change rate is defined by a ratio of an amplitude of the vibration arm 132 after the piezoelectric film is applied with a thermal load of 240° C. and cooled down to room temperature, to an amplitude thereof at room temperature before the piezoelectric film is applied with the thermal load of 240° C. It can be seen from FIG. 8 that favorable heat resistance can be obtained in a range in which the X-ray diffraction peak intensity ratio of the pyrochlore phase is small. Moreover, it can also be recognized that the heat resistance drops prominently near where the X-ray diffraction peak intensity ratio of the pyrochlore phase exceeds 0.1(10%).

It can be seen from the results of FIGS. 7 and 8 that by suppressing the X-ray diffraction peak intensity ratio of the pyrochlore phase to be 10% or less, a piezoelectric film having excellent piezoelectric characteristics and heat resistance can be formed.

The piezoelectric film 33 is formed such that the perovskite phase has an orientation rate of 60% or more in a (100)/(001) direction. Accordingly, even when the piezoelectric film is exposed to a high-temperature environment, it becomes possible to suppress deterioration of the piezoelectric characteristics and stably maintain desired piezoelectric characteristics. Here, an orientation rate in the (100)/(001) direction means that a peak intensity of a (100)/(001) plane orientation of the perovskite phase measured by the X-ray diffraction method is 60% or more with respect to a sum of peak intensities of a (100) plane orientation, a (001) plane orientation, a (110) plane orientation, a (101) plane orientation, and a (111) plane orientation of the perovskite phase. Moreover, the description of (100)/(001) refers to a (100) direction and/or a (001) direction. This is because the (100) direction and the (001) direction measured by the X-ray diffraction method are extremely close to each other and it is thus difficult to split those two and specify one from the other. Thus, no significant importance is placed in splitting those two and specifying one from the other.

In the specification, the X-diffraction peaks of the (100) plane orientation, the (001) plane orientation, the (110) plane orientation, the (101) plane orientation, and the (111) plane orientation of the perovskite phase are obtained at about 22.0°, 21.4°, 31.4°, 30.9°, and 38.3°, respectively, at 2θ(°). Further, the X-ray diffraction peak of the pyrochlore phase is obtained at about 29.5° at 2θ(°).

Figure 9:
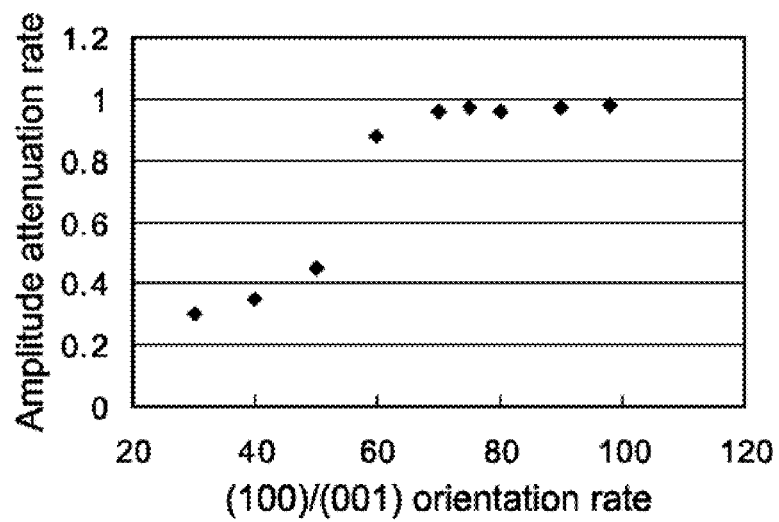
FIG. 9 is an experimental result showing a relationship between a (100)/(001) orientation rate of a perovskite phase and heat resistance in the PZT thin film constituting the angular velocity sensor device.

FIG. 9 shows a relationship between an orientation rate of the perovskite phase in the (100)/(001) direction and heat resistance of the piezoelectric film. The heat resistance of the piezoelectric film was evaluated by an amplitude change rate of the vibration arm 132 of the angular velocity sensor device 31. Here, the amplitude change rate is defined by a ratio of an amplitude of the vibration arm 132 after the piezoelectric film is applied with a thermal load of 240° C. and cooled down to room temperature, to an amplitude thereof at room temperature before the piezoelectric film is applied with the thermal load of 240° C. It can be seen from FIG. 9 that the orientation rate of the perovskite phase in the (100)/(001) direction largely depends on the heat resistance of the piezoelectric film. Especially when the orientation rate in the (100)/(001) direction is 60% or more, high heat resistance can be maintained stably.

The piezoelectric characteristics and heat resistance of the piezoelectric film also largely relate to a film thickness of the piezoelectric film. In this embodiment, the piezoelectric film 33 has a thickness of 400 nm or more and 1,000 nm or less. This is because in both cases where the thickness of the piezoelectric film 33 is smaller than 400 nm and the thickness thereof is larger than 1,000 nm, the piezoelectric constant drops prominently as compared to the case where the film thickness is within the above range, and desired piezoelectric characteristics can hardly be obtained.

Figure 10:
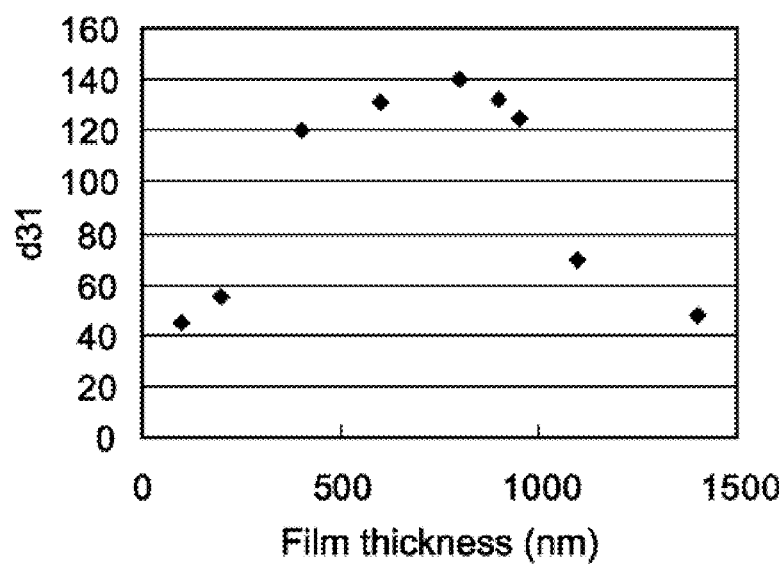
FIG. 10 is an experimental result showing a relationship between a film thickness and the piezoelectric constant (d31) of the PZT thin film constituting the angular velocity sensor device.

FIG. 10 shows a relationship between a film thickness of the piezoelectric film 33 and the piezoelectric constant (d31). It can be seen that more favorable piezoelectric characteristics can be obtained when the film thickness is within the range of 400 nm or more and 1,000 nm or less than in other ranges.

Figure 11:
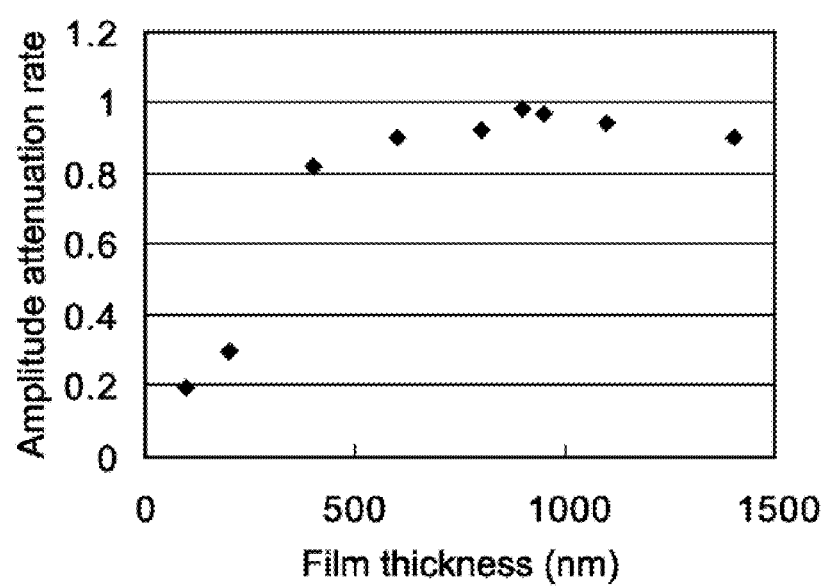
FIG. 11 is an experimental result showing a relationship between the film thickness and heat resistance of the PZT thin film constituting the angular velocity sensor device.

FIG. 11 shows a relationship between a film thickness of the piezoelectric film 33 and heat resistance thereof. The heat resistance of the piezoelectric film was evaluated by an amplitude change rate of the vibration arm 132 of the angular velocity sensor device 31. Here, the amplitude change rate is defined by a ratio of an amplitude of the vibration arm 132 after the piezoelectric film is applied with a thermal load of 240° C. and cooled down to room temperature, to an amplitude thereof at room temperature before the piezoelectric film is applied with the thermal load of 240° C. It can be seen from FIG. 11 that favorable heat resistance can be stably maintained when the film thickness is 400 nm or more.

It can be seen from the results of FIGS. 10 and 11 that a range of the film thickness of the piezoelectric film 33 with which favorable piezoelectric characteristics and heat resistance can be obtained at the same time is the range of 400 nm or more and 1,000 nm or less.

The base body 130 of the angular velocity sensor device 31 includes a lead electrode including lead wires 136, electrode pads 138, bumps 134a to 134d, and the like. The bump 134b is connected to the second electrode film 34b, and the bumps 134c and 134d are respectively connected to the first detection electrode 34c and the second detection electrode 34d. In addition, the bump 134a is connected to the first electrode film 34a. The bumps 134a to 134d are each formed of gold, for example, but are not limited thereto.

The angular velocity sensor device 31 is mounted on a wiring substrate (not shown) via the bumps 134a to 134d. The angular velocity sensor device 31 and the wiring substrate constitute an angular velocity sensor, and the angular velocity sensor is packaged as a sensor module, for example. Furthermore, the angular velocity sensor is connected to a control circuit of an electronic apparatus (not shown) via the wiring substrate. Examples of the electronic apparatus include a digital camera, a portable information terminal, a portable game device, and a handheld-type display apparatus.

Next, a typical operational example of the angular velocity sensor device 31 will be described.

The first electrode film 34a of the piezoelectric functional layer 139 is connected to a reference electrode (ground potential or predetermined offset potential), and the second electrode film 34b is applied with an AC voltage of a predetermined frequency as a drive signal from the control circuit. As a result, a voltage is applied to the piezoelectric film 33 interposed between the first electrode film 34a and the second electrode film 34b, and the vibration arm 132 is thus caused of a flexion movement in a vertical direction (Y direction in FIG. 1).

Upon application of an angular velocity $\omega_0$ about the vibration arm 132 with respect to the flexion movement of the vibration arm 132 as shown in FIG. 1A, Coriolis force is generated in the vibration arm 132. The Coriolis force is generated in a direction vertical to a direction of the flexion movement of the vibration arm 132 (Y direction) (mainly X direction), a magnitude of which is proportional to a value of the applied angular velocity $\omega_0$. The Coriolis force is converted into an electric signal by the piezoelectric film 33, and the converted signal is detected by the detection electrodes 34c and 34d.

Next, while specifically describing a production method of the angular velocity sensor device 31, descriptions will be given on piezoelectric performance, heat resistance, and the like of the piezoelectric film 33. It should be noted that a method of forming a piezoelectric functional layer 139 on an arm base 133 will mainly be described.

First, a silicon wafer is prepared. An oxidation protection film may be formed on the silicon wafer by thermal oxidation processing.

The first electrode film 34a is formed by depositing Ti of 30 nm on the silicon wafer and then depositing Pt of 100 nm by a sputtering method, for example. In this case, the deposition method is not limited to the sputtering method, and a vacuum vapor deposition method or other deposition methods may be used.

Next, the piezoelectric film 33 is formed by forming a PZT thin film on the first electrode film 34a by, for example, a sputtering method. A film thickness of the piezoelectric film 33 is 400 nm or more and 1,000 nm or less. Sputtering conditions are not particularly limited and can be set to optimal conditions according to a structure and specification of a deposition apparatus. Taking a magnetron sputtering apparatus as an example, a piezoelectric film can be formed by using, for example, $Pb_{1.04}(Zr_{0.50}Ti_{0.50})O_{3.04}$ (i.e., X=0.04, Y=0.50) as a target at room temperature under conditions set such that a gas pressure is 0.2 to 3 Pa, an atmosphere is a mixed-gas atmosphere of Ar and oxygen, and RF power is 0.1 to 5 kW.

The deposition method of the piezoelectric film 33 is not limited to the sputtering method, and deposition methods such as a vacuum vapor deposition method, a PLD (pulsed laser deposition) method, a sol-gel method, an aerosol deposition method, and the like may be used instead.

Moreover, by heating the silicon wafer during the deposition of the piezoelectric film 33, crystallization of the PZT thin film can be promoted. A heating temperature can be set to be 400° C. or more and 600° C. or less.

In the piezoelectric film 33 right after the deposition, a perovskite phase and a pyrochlore phase coexist. As described above, for enhancing the piezoelectric characteristics and heat resistance of the piezoelectric film, it is necessary to lower an abundance ratio of the pyrochlore phase in the piezoelectric film. In this regard, in this embodiment, a heat treatment of the piezoelectric film 33 is carried out for the purpose of eliminating the pyrochlore phase in the film after the piezoelectric film 33 is formed. For eliminating the pyrochlore phase, a rate of temperature rise and temperature in the heat treatment are importance parameters.

Figure 12:
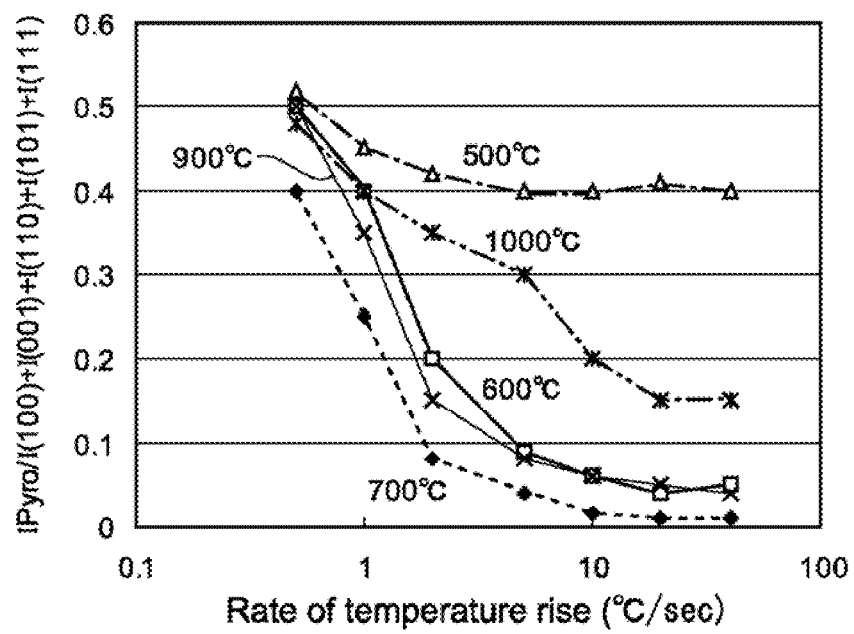
FIG. 12 is an experimental result showing a relationship between a rate of temperature rise in a heat treatment performed on the PZT thin film constituting the angular velocity sensor device and the X-ray diffraction peak intensity ratio of the pyrochlore phase in the film.
Figure 13:
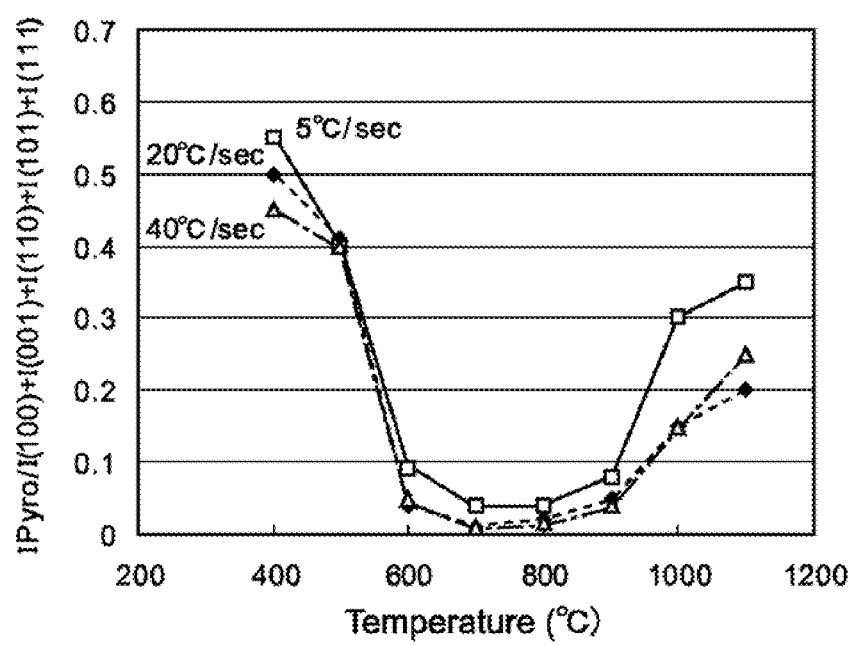
FIG. 13 is an experimental result showing a relationship between a temperature in the heat treatment performed on the PZT thin film constituting the angular velocity sensor device and the X-ray diffraction peak intensity ratio of the pyrochlore phase in the film.

FIG. 12 shows a relationship between a rate of temperature rise (° C./sec) in the heat treatment of the PZT film and an X-ray diffraction peak intensity ratio of the pyrochlore phase in the film. The rate of temperature rise on the abscissa axis is in a logarithmic scale. FIG. 13 shows a relationship between a heat treatment temperature of the PZT film and the X-ray diffraction peak intensity ratio of the pyrochlore phase in the film. A heat treatment atmosphere is an oxygen gas atmosphere under reduced pressure, and a retention time at the heat treatment temperature is 10 minutes or more.

It can be seen from FIG. 12 that the X-ray diffraction peak intensity ratio of the pyrochlore phase decreases as the rate of temperature rise increases. In other words, the pyrochlore phase is more apt to disappear as the rate of temperature rise increases. Moreover, as shown in FIG. 13, it becomes possible to suppress the X-ray diffraction peak intensity ratio of the pyrochlore phase to be 10% or less when the heat treatment temperature is within the range of 600° C. or more and 900° C. or less.

Therefore, a heat treatment condition under which the X-ray diffraction peak intensity ratio of the pyrochlore phase in the PZT film can be suppressed to be 10% or less is a rate of temperature rise of 5° C./sec or more and a heat treatment temperature of 600° C. or more and 900° C. or less (retention time of 10 minutes or more).

In the example above, the heat treatment for eliminating the pyrochlore phase has been carried out under a reduced pressure. Alternatively, the heat treatment may be carried out under an atmospheric pressure. In addition, although the heat treatment atmosphere has been an oxygen gas atmosphere, it may be an atmosphere or the like as long as it includes oxygen gas.

Figure 14:
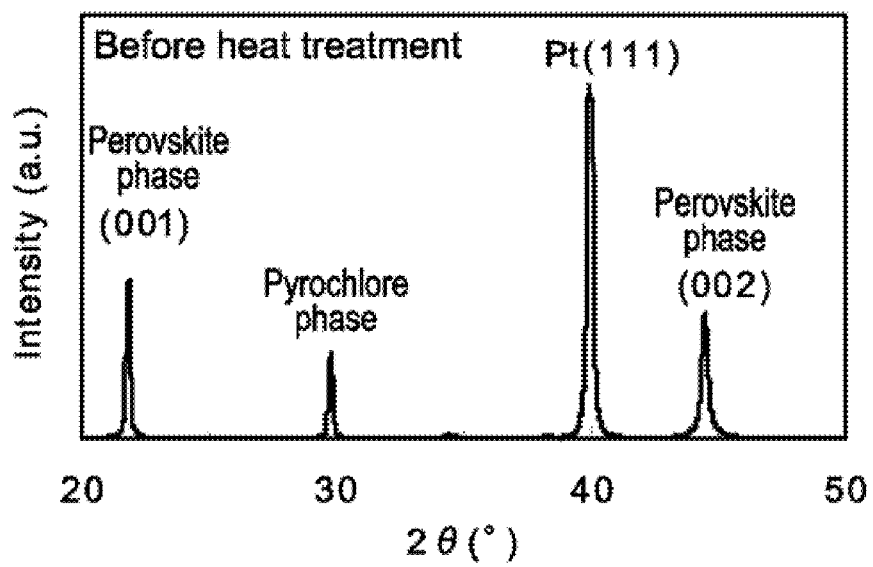
FIG. 14 is a diagram showing an example of an X-ray diffraction pattern prior to the heat treatment of the PZT thin film constituting the angular velocity sensor device.
Figure 15:
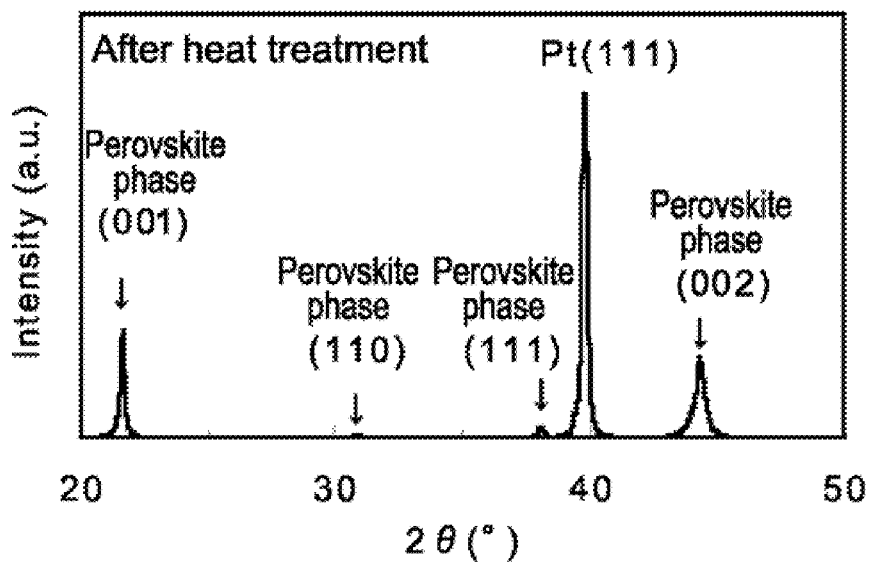
FIG. 15 is a diagram showing an example of the X-ray diffraction pattern after the heat treatment of the PZT thin film constituting the angular velocity sensor device.

FIGS. 14 and 15 show an example of X-ray diffraction patterns of a PZT film before and after the heat treatment. FIG. 14 shows a sample before the heat treatment and FIG. 15 shows a sample after the heat treatment. The heat treatment condition was set such that the rate of temperature rise is 20° C./sec and the heat treatment temperature is 700° C. As is apparent from FIGS. 14 and 15, it was confirmed that the pyrochlore phase (2θ=29°) that existed right after the deposition almost completely disappeared by the heat treatment.

Figure 16:
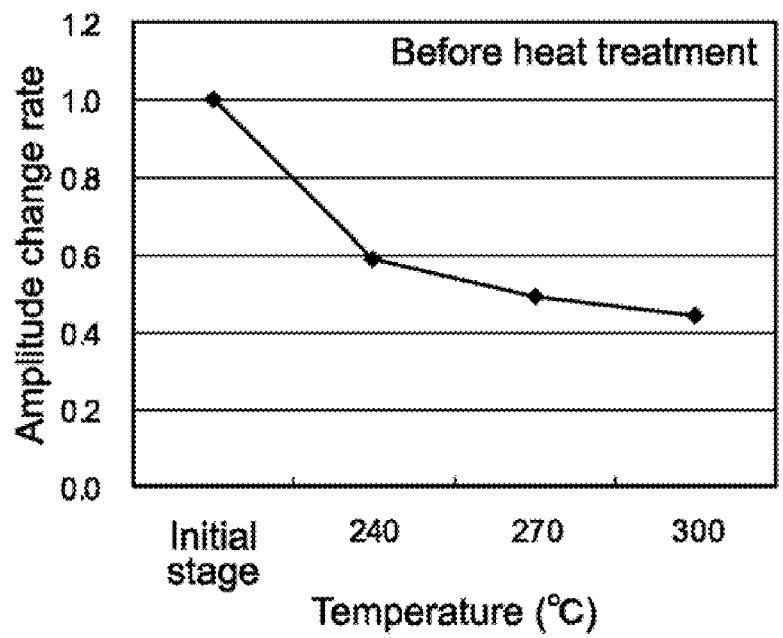
FIG. 16 is an experimental result of a heat resistance evaluation performed prior to the heat treatment of the PZT thin film constituting the angular velocity sensor device.
Figure 17:
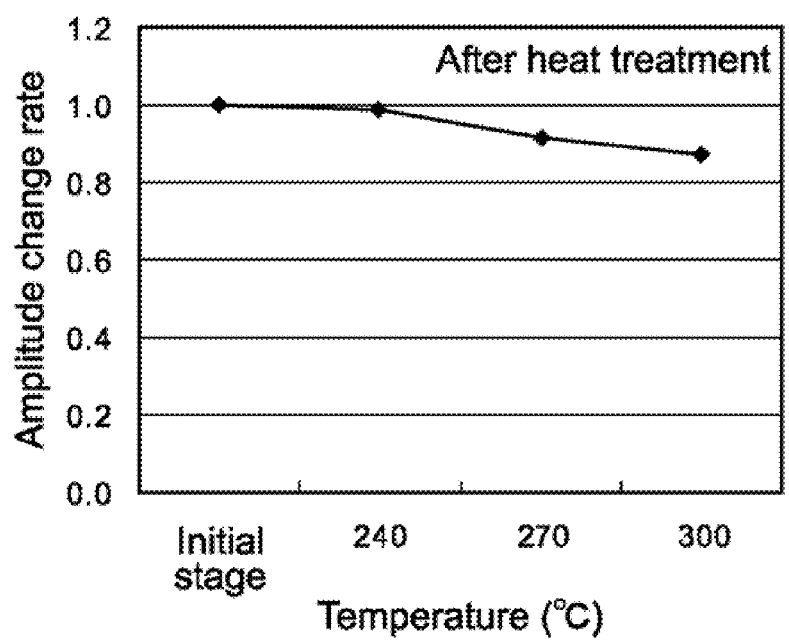
FIG. 17 is an experimental result of the heat resistance evaluation performed after the heat treatment of the PZT thin film constituting the angular velocity sensor device.

FIGS. 16 and 17 are experimental results of an evaluation on heat resistance of the PZT film before and after the heat treatment. FIG. 16 shows a sample before the heat treatment and FIG. 17 shows a sample after the heat treatment. The heat treatment condition was set such that the rate of temperature rise is 20° C./sec and the heat treatment temperature is 700° C. The heat resistance of the piezoelectric film was evaluated by an amplitude change rate of the vibration arm 132 of the angular velocity sensor device 31. Here, the amplitude change rate is defined by a ratio of an amplitude after an application of a thermal load to an amplitude before the heat treatment. A thermal load temperature was 240° C., 270° C., and 300° C.

It can be seen from FIG. 16 that the piezoelectric characteristics drop prominently after the application of a thermal load in a case where the piezoelectric film is not subjected to the heat treatment. The drop of the piezoelectric characteristics becomes larger as the thermal load temperature increases. This is due to a presence of the pyrochlore phase in the film. The X-ray diffraction peak intensity ratio of the pyrochlore phase at this time was 54%. On the other hand, as shown in FIG. 17, in a case where the piezoelectric film is subjected to the heat treatment, no deterioration of the piezoelectric characteristics was recognized up until the thermal load of 240° C. As an example, a reflow temperature of a typical lead-free solder material corresponds to the thermal load of 240° C. This means that in this case, even when the angular velocity sensor device 31 is mounted on a wiring substrate by reflow, piezoelectric characteristics of the piezoelectric film 33 do not change depending on the reflow temperature. Moreover, it can be seen that even with respect to a thermal load exceeding 240° C., a change amount of the amplitude is far smaller than that of the sample before the heat treatment (FIG. 16).

Upon forming the piezoelectric film 33 of the angular velocity sensor device 31, a Pt film having a film thickness of 200 nm is then formed on the piezoelectric film 33 as an electrode layer by a sputtering method. Furthermore, by patterning the Pt film, the second electrode film 34b and detection electrodes 34c and 34d are formed. The deposition method of the Pt film is not limited to the sputtering method, and a vacuum vapor deposition method or other deposition methods may be used instead.

By applying a voltage to the first electrode film 34a and the second electrode film 34b under an-air atmosphere heated to 240° C., polarization processing of the piezoelectric film 33 is carried out. The voltage applied between the first electrode film 34a and the second electrode film 34b in the polarization processing can be set to be 1 to 20 times as large as a coercive electric field $E_c$. Moreover, a temperature in the polarization processing is, compared to a Curie temperature (° C.) of the piezoelectric film, 1/16 to 5/4 the Curie temperature, more desirably 1/4 to 1 time the Curie temperature. The polarization processing may be carried out in any of an air atmosphere, an oxygen atmosphere, and a nitrogen atmosphere.

The angular velocity sensor device 31 is produced as described above.

Since the abundance ratio of the pyrochlore phase in the piezoelectric film 33 can be significantly reduced according to this embodiment, excellent heat resistance can be imparted to the piezoelectric film while maintaining favorable piezoelectric characteristics. As a result, favorable piezoelectric characteristics can be secured even after the angular velocity sensor device 31 is produced and mounted to a wiring substrate by reflow, and characteristics of the angular velocity sensor can be improved.

Moreover, since heat resistance of the piezoelectric film 33 can be enhanced according to this embodiment, it becomes possible to suppress a drop of a detection sensitivity of an angular velocity even under a severe temperature condition inside the electronic apparatus, with the result that reliability of the electronic apparatus can be improved.

Subsequently, another embodiment will be described with reference to FIGS. 18 and 19.

Figure 18:
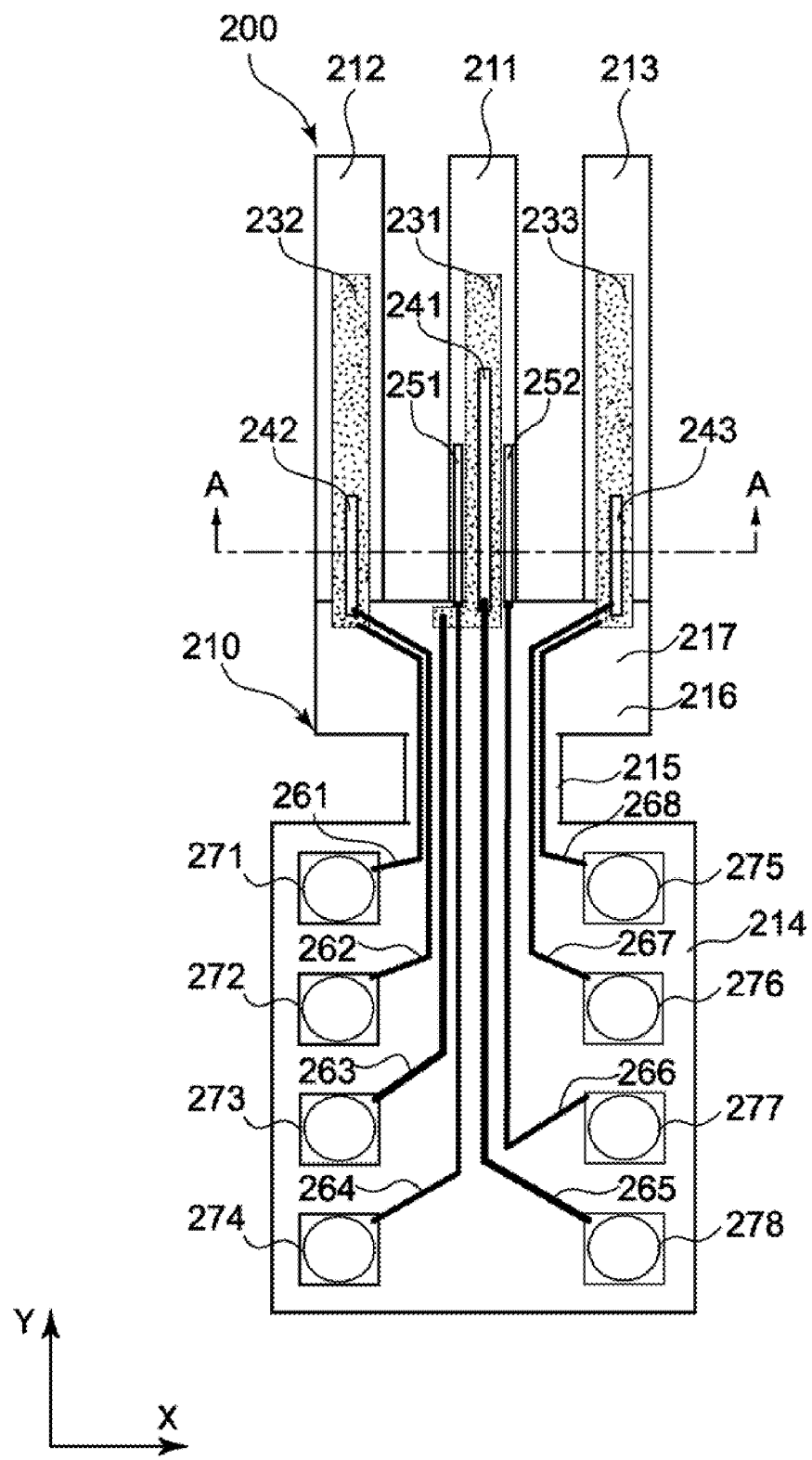
FIG. 18 is a plan view of an angular velocity sensor device according to another embodiment showing a schematic structure on a mounting surface side.
Figure 19:
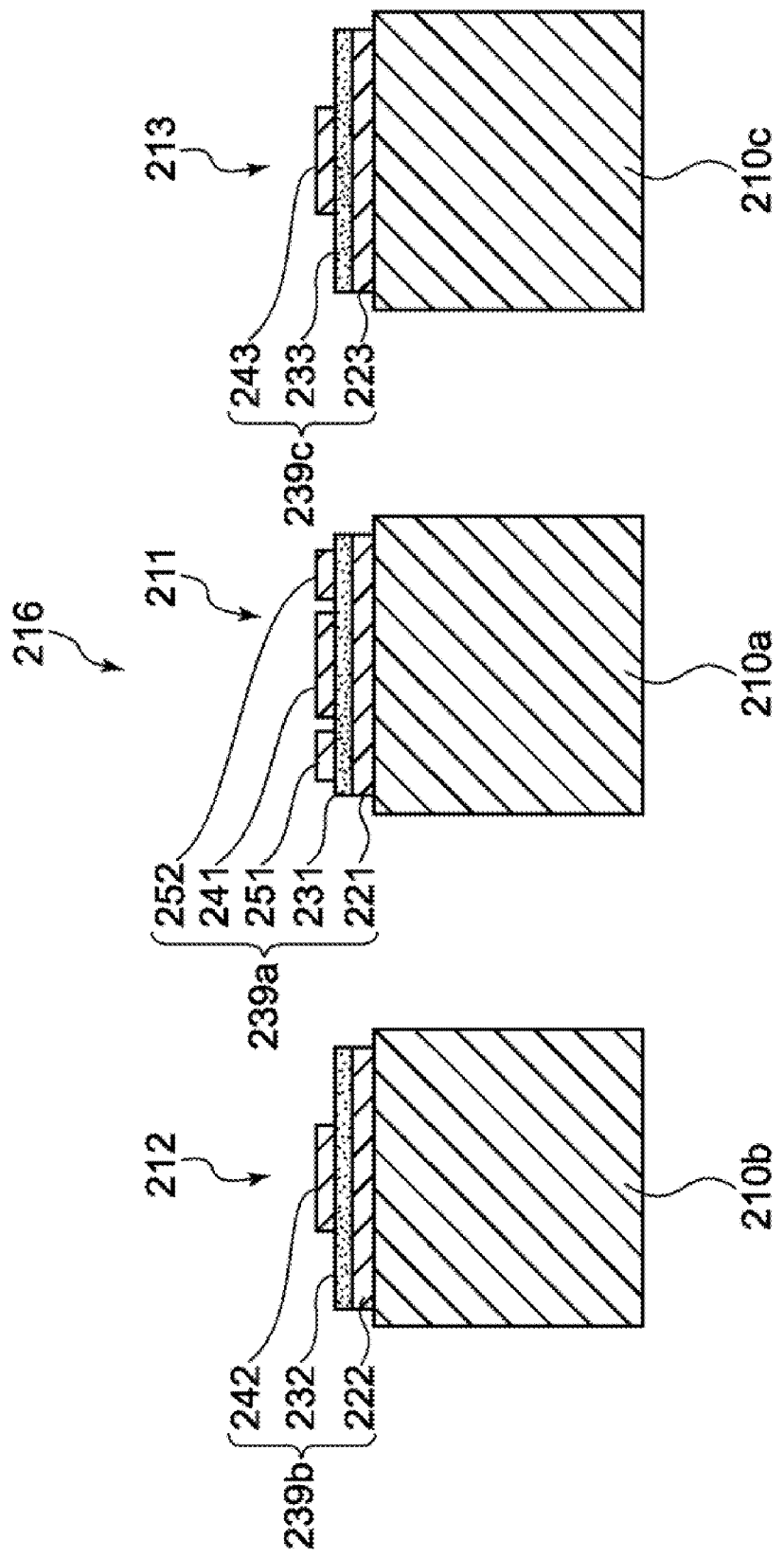
FIG. 19 is a cross-sectional diagram taken along the line (A)-(A) in FIG. 18.

FIG. 18 is a plan view showing an angular velocity sensor device according to this embodiment, and FIG. 19 is a cross-sectional diagram of the angular velocity sensor device taken along the line A-A in FIG. 18.

As shown in the figures, an angular velocity sensor device 200 includes a base body 214, an arm retention portion 215 provided on one side of the base body 214, and a vibration arm portion 216 provided on a tip end side of the arm retention portion 215.

The vibration arm portion 216 includes a first vibration arm 211, and second and third vibration arms 212 and 213 on both sides of the first vibration arm 211. The first vibration arm 211 is constituted of an arm base 210a and a piezoelectric functional layer 239a formed thereon, the second vibration arm 212 is constituted of an arm base 210b and a piezoelectric functional layer 239b formed thereon, and the third vibration arm 213 is constituted of an arm base 210c and a piezoelectric functional layer 239c formed thereon. In other words, the angular velocity sensor device 200 according to this embodiment is a so-called triple-branch tuning-fork type angular velocity sensor device.

The first to third vibration arms 211 to 213 have the same length, width, and thickness, for example. Moreover, a gap between the first and second vibration arms 211 and 212 and a gap between the first and third vibration arms 211 and 213 are the same.

As shown in FIG. 19, first electrode films 221 to 223 are respectively formed on the arm bases 210a to 210c, and PZT thin films 231 to 233 each as a piezoelectric film are respectively laminated on the first electrode films 221 to 223. Further, second electrode films 241 to 243 each as a drive electrode are respectively laminated on the PZT thin films 231 to 233. Moreover, a first detection electrode 251 and a second detection electrode 252 are laminated on the piezoelectric thin film 231 of the first vibration arm 211 in the middle of the vibration arm portion 216.

A film thickness of each of the PZT thin films 231 to 233 and a PbO excessive composition ratio X and Zr composition ratio Y of the PZT are the same as those of the PZT thin film 33 according to the first embodiment. Further, as in the piezoelectric film 33, in the PZT thin films 231 to 233, a peak intensity of a pyrochlore phase measured by an X-ray diffraction method is set to be 10% or less with respect to a sum of peak intensities of a (100) plane orientation, a (001) plane orientation, a (110) plane orientation, a (101) plane orientation, and a (111) plane orientation of a perovskite phase.

The plurality of electrodes 221 to 223, 241 to 243, 251, and 252 included in the respective piezoelectric functional layers 239 are respectively connected to lead wires 261 to 268. The lead wires 261 to 268 pass through a surface of the arm retention portion 215 to be respectively connected to lead terminals 271 to 278 provided on a surface of the base body 214. The lead terminals 271 to 278 are provided four each on both sides of the surface of the base body 214 in an X direction.

Next, an operation of the angular velocity sensor device 200 according to this embodiment will be described.

The first vibration arm 211 is caused of a flexion movement in the vertical direction of FIG. 19 when a voltage is applied between the first electrode film 221 and the second electrode film 241. Meanwhile, the second and third vibration arms 212 and 213 are caused of a flexion movement in the vertical direction at a phase opposite to that of the first vibration arm 211 when a voltage is applied between the first electrode films 222 and 223 and second electrode films 242 and 243, respectively.

Specifically, the second and third vibration arms 212 and 213 move downward when the first vibration arm 211 moves upward, and the second and third vibration arms 212 and 213 move upward when the first vibration arm 211 moves downward. Moreover, by the second and third vibration arms 212 and 213 being caused of the flexion movement at an amplitude half the amplitude of the First vibration arm 211, moments generated by the first to third vibration arms 211 to 213 are canceled out.

It has been confirmed that the piezoelectric functional layers 239 of the angular velocity sensor device 200 structured as described above also have the same piezoelectric performance and heat resistance as the piezoelectric functional layer 139 of the angular velocity sensor device 31 of the first embodiment.

Although the above embodiments have exemplified an angular velocity sensor (angular velocity sensor device) as the piezoelectric device, the present application is not limited thereto, and the present application is also applicable to a pyroelectric infrared ray sensor, a liquid injection apparatus, a semiconductor storage apparatus, and the like.

The above embodiments have respectively illustrated a so-called single-branch tuning-fork type angular velocity sensor device 31 and triple-branch tuning-fork type angular velocity sensor device 200. However, the number of vibration arms may be 2, or more than 3. Alternatively, although the angular velocity sensor devices 31 and 200 each have a cantilever structure, the sensors may each have a center impeller structure.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A piezoelectric device comprising:
a substrate;
a first electrode film formed on the substrate;
a piezoelectric film represented by $Pb_{1+X}(Zr_Y Ti_{1-Y})O_{3+X}$ ($0 \leq X \leq 0.3$, $0 \leq Y \leq 0.55$) whose peak intensity of a pyrochlore phase measured by an X-ray diffraction method is 10% or less with respect to a sum of peak intensities of a (100) plane orientation, a (001) plane orientation, a (110) plane orientation, a (101) plane orientation, and a (111) plane orientation of a perovskite phase, the piezoelectric film being formed on the first electrode film with a film thickness of 400 nm or more and 1,000 nm or less; and
a second electrode film laminated on the piezoelectric film.

2. The piezoelectric device according to claim 1, wherein the perovskite phase has an orientation rate of 60% or more in a (100)/(001) direction.

3. The piezoelectric device according to claim 1, wherein the piezoelectric film is represented by $Pb_{1+X}(Zr_Y Ti_{1-Y})O_{3+X}$ ($0 \leq X \leq 0.3$, $0.4 \leq Y \leq 0.55$).

4. The piezoelectric device according to claim 1, wherein the piezoelectric film is subjected to a heat treatment at a temperature of 600° C. or more and 900° C. or less.

5. The piezoelectric device according to claim 4, wherein a rate of temperature rise in the heat treatment is 5° C./sec or more.

6. The piezoelectric device according to claim 1, wherein the substrate is subjected to a heat treatment at a temperature of 400° C. or more and 600° C. or less during deposition of the piezoelectric film.

7. The piezoelectric device according to claim 1, wherein the piezoelectric film is constituted of a sputter film.

8. An angular velocity sensor comprising:
a substrate;
a first electrode film formed on the substrate;
a piezoelectric film represented by $Pb_{1+X}(Zr_Y Ti_{1-Y})O_{3+X}$ ($0 \leq X \leq 0.3$, $0 \leq Y \leq 0.55$) whose peak intensity of a pyrochlore phase measured by an X-ray diffraction method is 10% or less with respect to a sum of peak intensities of a (100) plane orientation, a (001) plane orientation, a (110) plane orientation, a (101) plane orientation, and a (111) plane orientation of a perovskite phase, the piezoelectric film being formed on the first electrode film with a film thickness of 400 nm or more and 1,000 nm or less; and
a second electrode film laminated on the piezoelectric film.

9. An electronic apparatus equipped with an angular velocity sensor, the angular velocity sensor comprising:

a substrate;

a first electrode film formed on the substrate;

a piezoelectric film represented by $Pb_{1+X}(Zr_YTi_{1-Y})O_{3+X}$ ($0 \leq X \leq 0.3$, $0 \leq Y \leq 0.55$) whose peak intensity of a pyrochlore phase measured by an X-ray diffraction method is 10% or less with respect to a sum of peak intensities of a (100) plane orientation, a (001) plane orientation, a (110) plane orientation, a (101) plane orientation, and a (111) plane orientation of a perovskite phase, the piezoelectric film being formed on the first electrode film with a film thickness of 400 nm or more and 1,000 nm or less; and a second electrode film laminated on the piezoelectric film.

* * * * *